United States Patent [19]

Yoshida et al.

[11] Patent Number: 4,831,424
[45] Date of Patent: May 16, 1989

[54] INSULATED GATE SEMICONDUCTOR DEVICE WITH BACK-TO-BACK DIODES

[75] Inventors: Isao Yoshida; Takeaki Okabe, both of Hinode; Mitsuo Ito, Gunma; Kazutoshi Ashikawa; Tetsuo Iijima, both of Takasaki, all of Japan

[73] Assignee: Hitachi, Ltd., Tokyo, Japan

[21] Appl. No.: 62,388

[22] Filed: Jun. 15, 1987

Related U.S. Application Data

[63] Continuation of Ser. No. 402,236, Jul. 27, 1982, abandoned.

[30] Foreign Application Priority Data

Aug. 7, 1981 [JP] Japan .................................. 56-122995

[51] Int. Cl.⁴ .......................................... H01L 29/78
[52] U.S. Cl. ............................ 357/23.13; 357/23.14; 357/23.4; 357/23.8; 357/59; 357/52; 357/13; 357/41
[58] Field of Search ................... 357/23.13, 23.8, 23.4, 357/23.14, 59 G, 59 E, 52, 13, 41

[56] References Cited

U.S. PATENT DOCUMENTS

| | | | |
|---|---|---|---|
| 3,673,428 | 6/1972 | Athanas | 357/23.13 X |
| 3,728,591 | 4/1973 | Sunshine | 357/41 X |
| 3,748,547 | 7/1973 | Sugimoto | 357/23.13 X |
| 3,806,773 | 4/1974 | Watanabe | 357/23.13 |
| 4,062,039 | 12/1977 | Nishimura | 357/13 X |
| 4,072,975 | 2/1978 | Ishitani | 357/23.13 |
| 4,261,004 | 4/1981 | Masuhara et al. | 357/23.13 X |
| 4,267,011 | 5/1981 | Shibata et al. | 357/59 G |
| 4,312,680 | 1/1982 | Hsu | 357/59 G |
| 4,492,974 | 1/1985 | Yoshida et al. | 357/23.13 |
| 4,584,760 | 4/1986 | Okazawa | 357/59 G |
| 4,686,551 | 8/1987 | Mihara | 357/23.4 |

FOREIGN PATENT DOCUMENTS

| | | | |
|---|---|---|---|
| 0060635 | 9/1982 | European Pat. Off. | 357/23.13 |
| 2215850 | 2/1973 | Fed. Rep. of Germany | 357/23.13 X |
| 2145460 | 2/1973 | France | 357/23.13 |

OTHER PUBLICATIONS

Patent Abstracts of Japan, E-27, Sep. 25, 1980, vol. 4, No. 237, No. 55-91173.

Severns, "MOSFETs Rise to New Levels of Power", Electronics, May 22, 1980, pp. 143-152.

Primary Examiner—Andrew J. James
Assistant Examiner—William A. Mintel
Attorney, Agent, or Firm—Antonelli, Terry & Wands

[57] ABSTRACT

An insulated gate semiconductor device contains a protective element for protecting the gate electrode of an insulated gate field effect transistor. The protective element is formed of the same semiconductor layer as that of the gate electrode of the insulated gate field effect transistor and is formed integrally with the gate electrode on an insulating film formed on the surface of a semiconductor substrate.

14 Claims, 9 Drawing Sheets

INSULATED GATE SEMICONDUCTOR DEVICE WITH BACK-TO-BACK DIODES

This application is a continuation of application Ser. No. 402,236, filed on July 27, 1982, now abandoned.

FIELD OF THE INVENTION

The present invention relates to an insulated gate semiconductor device and to a method for its fabrication. More particularly, the present invention relates to an insulated gate field effect transistor having a protective element for preventing dielectric breakdown of its gate insulating film and to a method of fabricating such a transistor.

In the description to follow, the phrase insulated gate field effect transistor will be referred to simply as "MOSFET".

BACKGROUND OF THE INVENTION

A protective element such as a protective diode is generally disposed in the semiconductor substrate in which the MOSFET is formed. In a MOSFET having a structure in which the semiconductor substrate is also to function as a drain region (hereinafter referred to as a "vertical MOSFET"), however, it has been found that when a protective diode is provided, a thyristor operation occurs due to the presence of a parasitic transistor, causing permanent breakdown of the vertical MOSFET. This is a critical problem in practice.

To solve this problem, it has previously been proposed to provide a structure in which a protective element of this kind is disposed on an insulating film isolated from the MOSFET substrate (e.g. see U.S. Pat. No. 4,492,974). In this prior proposal, the protective element and the gate electrode of the MOSFET were formed of polycrystalline silicon and electrically connected to each other by a metallic wiring layer such as aluminum. This resulted in another problem of increased chip area.

SUMMARY OF THE INVENTION

It is, therefore, an object of the present invention to provide a novel insulated gate semiconductor device which does not cause any thyristor operation and a method of fabricating such a semiconductor device. To accomplish this object, the present invention is characterized in that a protective element for protecting the gate insulating film of a gate insulated field effect transistor consists of the same semiconductor layer as that of the gate electrode of the gate insulated field effect transistor and is formed integrally therewith.

BRIEF DESCRIPTION OF THE DRAWINGS

The accompanying drawings illustrate insulated gate semiconductor devices in accordance with preferred embodiments of the present invention, in which.

DESCRIPTION OF THE PREFERRED EMBODIMENTS

Hereinafter, preferred embodiments of the insulated gate semiconductor device will be described in detail.

Figure 1:
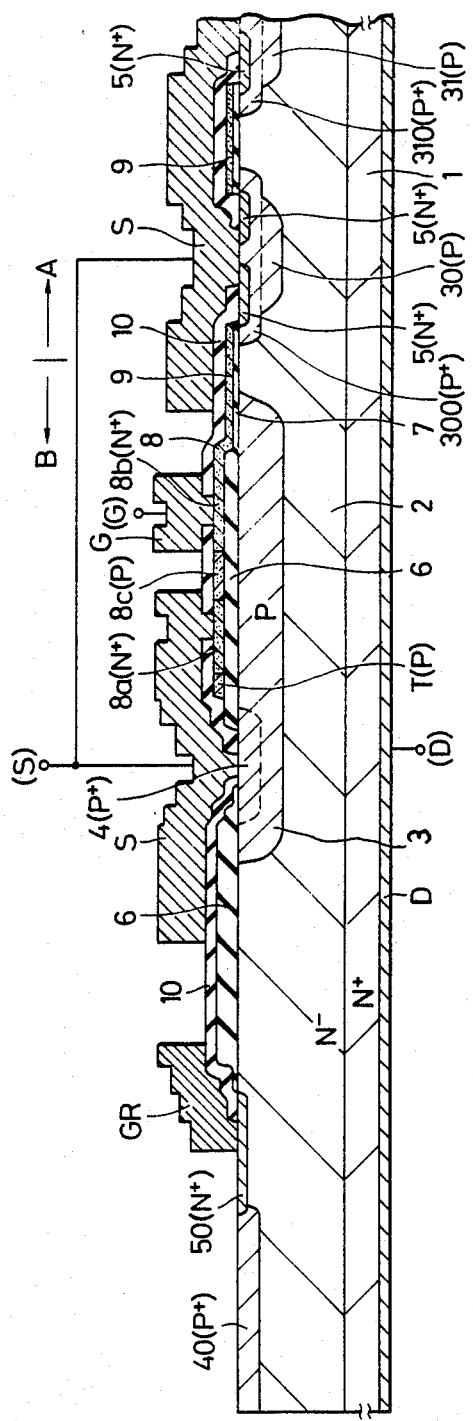
FIG. 1 is a sectional view of the principal portions of an N channel vertical MOSFET.

FIG. 1 is a sectional view of an N channel vertical MOSFET in accordance with an embodiment of the present invention.

In the drawing, the direction indicated by arrow A represents one portion of a semiconductor pellet in which a vertical MOSFET structure is formed. The direction indicated by arrow B represents the peripheral portion of the semiconductor pellet. In the vertical MOSFET shown in FIG. 1, an N− semiconductor (N− silicon) layer 2 is formed on one main surface of an N+ semiconductor (N+ silicon) substrate 1. This N+ semiconductor substrate 1 and N− semiconductor layer 2 function as the drain region of the MOSFET. P well regions 3, 30, 31 are selectively formed inside the N− semiconductor layer 2. The P well regions 3, 30, 31 shown in the drawing are independent of and isolated from one another.

P+ regions 300 and 310 are shallower than the P well regions 30 and 31, and self-aligned with a gate electrode 9 consisting of a polycrystalline semiconductor or so-called polycrystalline silicon inside the P well regions 30 and 31, respectively. An N+ region 5 is formed self-aligned with respect to the gate electrode 9 inside the P+ regions 300 and 310. This N+ region 5 serves as the source region of the MOSFET. A source electrode S consisting of a metal such as aluminum is connected to the N+ region 5 and to the P+ regions 300 and 310 via through-holes of an inter-layer insulating film such as a phosphosilicate glass film 10.

The surfaces of the P+ regions 300 and 310 form an N channel layer which connects the N− semiconductor layer (drain region) 2 to the N+ region (source region) 5 by a voltage applied to its gate electrode 9. In other words, the vertical MOSFET of the present invention is fundamentally composed of the N− semiconductor layer 2, the P+ regions 300, 310, the N+ region 5, the gate insulating film 7 and the gate electrode 9.

The P well regions 30 and 31 are formed in order to improve the withstand voltage (drain withstand voltage) of the P-N junctions between the N− semiconductor layer 2 and the P+ region 300 and between the N− semiconductor layer 2 and the P+ region 310, respectively. The P+ regions 300, 310 are one of the factors that determine the channel length (distance between the drain and source) and are formed with a reduced thickness so as to reduce the channel length. For this reason, the cylindrical portion of the above-mentioned P-N junction is likely to cause electric field concentration and be broken down by a low voltage. To prevent this breakdown, the P well regions 30 and 31, which are deeper than the P+ regions 300 and 310, are disposed to mitigate the electric field concentration upon the cylindrical portion of the P-N junction.

Next, a P+ contact region 4 is selectively formed inside the P well region 3. This P+ contact region is formed simultaneously with the formation of the P+ regions 300 and 310. The source electrode S is connected to this P+ contact region 4. The source electrode is formed so as to extend beyond the P well region 3 on the left side and to improve the withstand voltage of the P-N junction between the N− semiconductor layer 2 and the P well region 3. A field insulating film (field SiO2 film) 6 is formed on the surface of the P well region 2 and a polycrystalline semiconductor (polycrystalline silicon) layer 8 to be used as the protective element is formed on the surface of the field insulating film 6. As can be seen clearly from the drawing, this polycrystalline silicon layer 8 is formed to be continuous with gate electrode 9.

The polycrystalline semiconductor layer 8, which functions as the protective element, consists of N+ semiconductor portions 8a, 8b and a P semiconductor portion 8c interposed between these N+ semi-conductor portions 8a and 8b. The P-N junctions defined betwen the N+ semiconductor portion 8a and the P semiconductor portion 8c and between the N+ semiconductor portion 8b and the P semiconductor portion 8c together form the protective element of the MOSFET. That is to say, the polycrystalline semiconductor layer 8 forms a back-to-back diode. The P semiconductor portion 8c is converted into P type by doping with boron impurity when the P+ regions 300, 310 and the P+ contact region 4 are formed by doping with the boron impurity. This doping can be effected by ion implantation, for example. The ion implantation energy is about 75 KeV and the ion dose is about $8 \times 10^{13}$ atoms/cm$^2$ in this case. On the other hand, the N+ semiconductor portions 8a and 8b are converted into N type by doping with a P impurity when the N+ region (source region) 5 is formed by doping with P impurity. The doping can be done by ion implantation. The ion implantation energy is about 40 KeV and the ion dose is about $1.4 \times 10^{16}$ atoms/cm$^2$ in this case. The source electrode S is connected to the N+ semiconductor portion 8a via a through-hole of the phosphosilicate glass film 10. The gate electrode G, which is used as a lead-out electrode for the gate electrode 9, is connected to the N+ semiconductor portion 8b through a through-hole of the phosphosilicate glass film 10. This portion 8b is then connected to the gate electrode 9 to provide contact between the gate electrode 9 and the gate electrode G used for lead-out purposes. The gate electrode G is made of a metallic material such as aluminum in the same way as the source electrode S. On the other hand, the drain electrode D made of a metallic material such as aluminum or nickel is formed on the back surface of the N+ semiconductor substrate 1.

An N+ region 50 and a guard ring electrode GR form a channel stopper (means for restricting the parasitic channel formed on the surface of the N− semiconductor layer 2). This N+ region 50 is formed simultaneously with the formation of the N+ region 5. The P+ region 40 is a scribe region which does not affect the characteristics of the MOSFET. The scribe region is a portion in which lines are scribed to divide the semiconductor wafer into a plurality of semiconductor pellets. It is necessary that the field insulating film be completely removed from the surface of the scribe region to facilitate scribing. It is further preferred that this field insulating film be removed without increasing the number of fabrication steps. The present invention takes this requirement into consideration. Namely, the scribe region in this embodiment is masked in the same step with the source contact portion. Accordingly, a P+ region 40 having the same thickness as the P+ contact region 4 and P+ regions 300, 310 is formed inside the N− semiconductor layer 2.

In this embodiment, the dimension of each layer (or each film) is as follows:

N− semiconductor layer 2 . . . specific resistivity 20Ωcm, 35 μm thick;
P well regions 3, 30, 31 . . . 10 μm deep;
P+ regions 40, 300, 310, P+ contact region . . . 5 μm thick;
N+ regions 5, 50 . . . 1 μm thick;
field insulating film 6 . . . 1.2 μm–1.5 μm thick;
gate insulating film 7 . . . 0.12 μm thick;
polycrystalline semiconductor layer 8, gate electrode 9 . . . 0.45 μm thick;
phosphosilicate glass film 10 . . . 0.5 μm thick; and
source electrode S, gate electrode G, guard ring electrode GR . . . 4.0 μm, thick.

Figure 2:
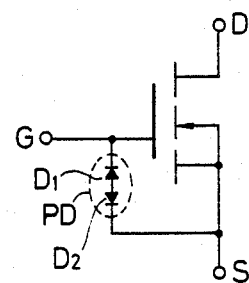
FIG. 2 is an equivalent circuit diagram of the N channel vertical MOSFET in accordance with the present invention.

An equivalent circuit diagram of the vertical MOSFET shown in FIG. 1 is shown in FIG. 2. In this drawing, PD represents a back-to-back diode functioning as the protective element. This back-to-back diode PD consists of the polycrystalline semiconductor layer 8 shown in FIG. 1. The diode $D_1$ in the back-to-back diode PD consists of the N+ semiconductor portion 8b and the P semiconductor portion 8c of FIG. 1, while diode $D_2$ is formed by the P semiconductor portion 8c and the N+ semiconductor portion 8a of FIG. 1.

Figure 3:
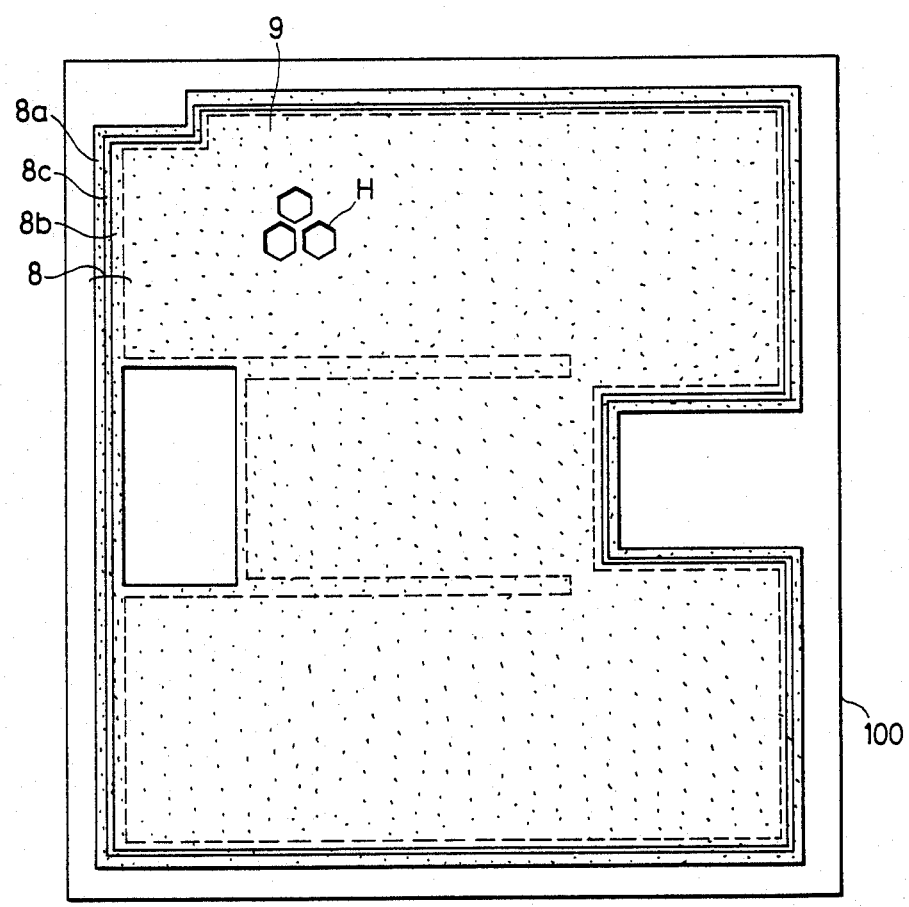
FIG. 3 is a plan view of the semiconductor chip and shows the position of the protective element.

The protective element shown in FIG. 1, or the polycrystalline semiconductor layer 8 (8a, 8b, 8c) and the gate electrode (polycrystalline semiconductor layer) layer 9 are formed on the surface of a semiconductor pellet 100 as shown in FIG. 3. In this drawing, the gate electrode 9 is shown formed in a mesh, like a honeycomb H, inside the entire frame represented by dotted lines. The polycrystalline semiconductor layer 8 is formed around the semiconductor pellet 100 encompassing this gate electrode 9.

Figure 4:
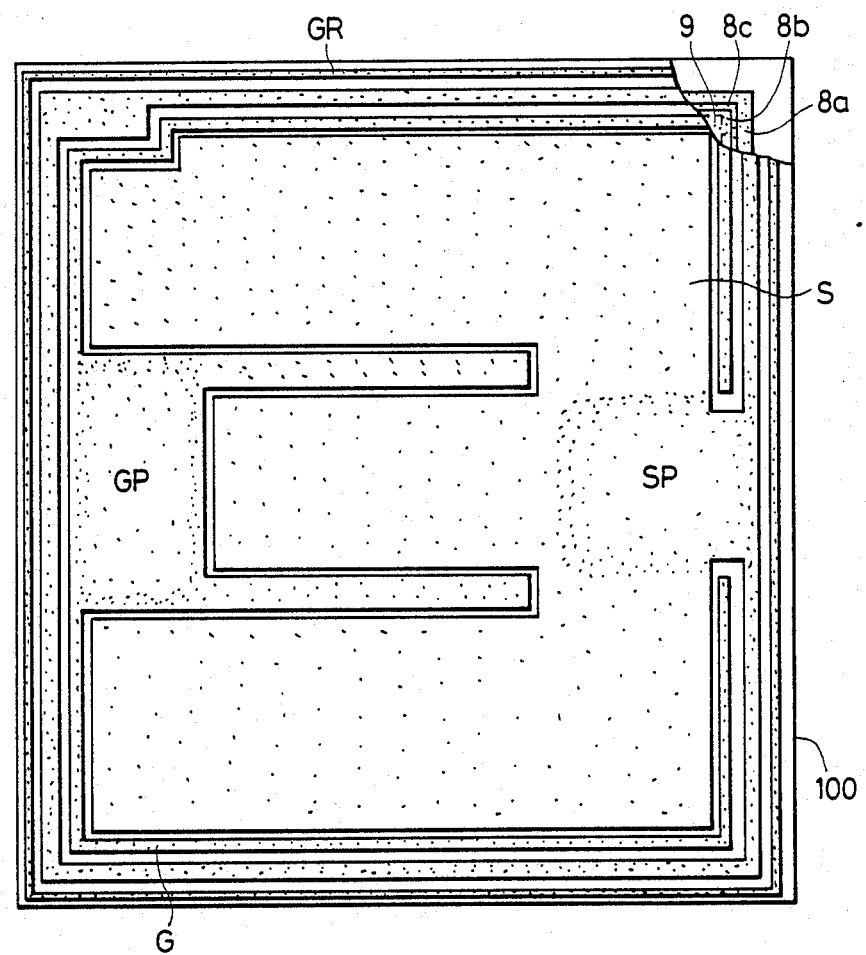
FIG. 4 is a plan view of the chip as a whole showing the disposition of the electrodes when the semiconductor device is completed.

The gate, source and guard ring electrodes G, S and GR are formed on the surface of the semiconductor pellet 100 on which the above-mentioned polycrystalline semiconductor layer 8 and the gate electrode 9 are formed, as shown in FIG. 4. Symbols GP and SP in FIG. 4 represent a bonding pad for extending the gate electrode to which a wire is connected and a bonding pad for extending the source electrode to which a wire is connected, respectively. To improve bonding capability, a polycrystalline semiconductor layer is not formed immediately below these bonding pads GP and SP as is obvious from FIG. 3.

The protective element will now be explained in detail with reference to FIGS. 5 and 6.

Figure 5:
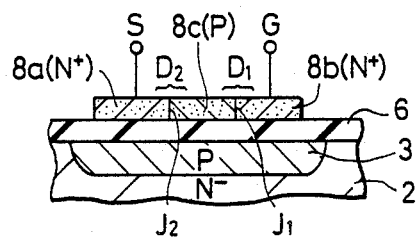
FIG. 5 is a sectional view of the polycrystalline Si layer which serves as the protective element.
Figure 6:
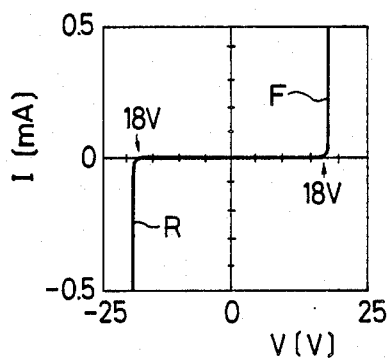
FIG. 6 depicts the current vs. voltage characteristic curve of the protective element.

FIG. 5 is an enlarged sectional view of the protective element (polycrystalline semiconductor layer 8) shown in FIG. 1. In this drawing, the withstand voltage of each of the diodes $D_1$ and $D_2$ is determined by the P semiconductor portion 8c, so that the amount of impurity (doping quantity of B impurity) for forming this P semiconductor portion 8c is important. The following parameters were established in experiments carried out by the inventors of the present invention.

When the impurity doping quantity is below $10^{13}$ atoms/cm$^2$, the diodes $D_1$, $D_2$ have a large series resistance and the withstand voltage of each of these diodes $D_1$, $D_2$ is determined by the punchthrough phenomenon. Hence, the breakdown withstand current drops remarkably. The withstand voltage of each of the diodes $D_1$, $D_2$ depends upon the machining accuracy and its variance is great. Accordingly, this impurity doping quantity (below $10^{13}$ atoms/cm$^2$) is not practical. On the other hand, if the impurity doping quantity is above $10^{15}$ atoms/cm$^2$, not only is the withstand voltage of each diode lowered but the leakage current also increases. Hence, this value is not practical either.

For the above-mentioned reasons, the most preferred range of the impurity doping quantity is from $10^{13}$ to $10^{15}$ atoms/cm$^2$. The impurity concentration of the P semiconductor portion 8c obtained by an impurity doping quantity within this range was found to be $10^{17}$ to $10^{19}$ atoms/cm$^2$. This impurity doping quantity is substantially in agreement with that when the P+ regions 300 and 310 of the MOSFET are formed. Accordingly, the semiconductor portion 8c can be formed simultaneously with the P+ regions 300 and 310. Incidentally, the impurity doping quantity for forming the N+ semiconductor portions 8a, 8b was $10^{15}$ atoms/cm$^2$ (impurity concentration $2.5 \times 10^{19}$ atoms/cm$^2$) or more.

In this embodiment, the impurity doping quantity was $8 \times 10^{13}$ atoms/cm$^2$ in the P semiconductor portion 8c and $1.4 \times 10^{16}$ atoms/cm$^2$ in the N+ portions 8a and 8b, as described above. When the current-voltage characteristics between the electrode S and the electrode G in this case were measured, it was found that the waveform in the forward direction F was symmetric to that in the reverse direction R about the origin as the center, and the withstand voltage was ±18 V. Thus, the protective element in this embodiment sufficiently protects the MOSFET.

For the above-mentioned reasons, this embodiment accomplishes the aforementioned object of the present invention.

As can be seen clearly from FIGS. 1, 3 and 5, the protective element is not formed inside the semiconductor substrate, but rather on the insulating film. Accordingly, the reliability of the vertical MOSFET in this embodiment is enhanced since no thyristor operation occurs.

Figure 7:
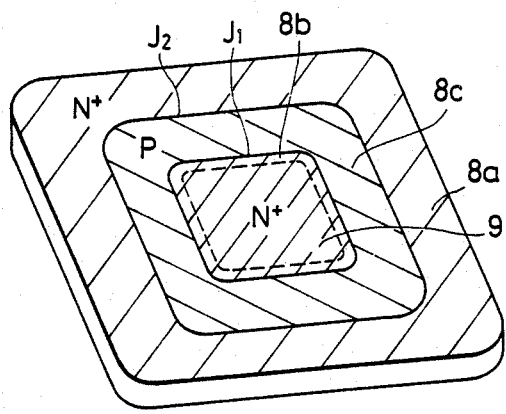
FIG. 7 is a perspective view showing the relation between the protective element and the gate electrode of the MOSFET.

Furthermore, this embodiment provides the following effects:

(1) As can been understood more clearly from FIG. 7, the protective element and the gate electrode of the MOSFET in this embodiment are formed integrally with each other by the polycrystalline semiconductor layer. Accordingly, specific means for connecting the protective element to the gate electrode are eliminated and the semiconductor chip area is not increased. As can also be seen from FIG. 7, the P-N junctions $J_1$ and $J_2$ are formed in a ring-like shape and the cross section of the junctions is not exposed. Hence, degradation of the characteristics of the protective element can be prevented.

(2) The protective element consisting of the polycrystalline semiconductor layers is formed on the insulating film (field insulating film 6) thicker than the gate insulating film (SiO$_2$) so that the influence of the field effect due to the drain voltage upon the protective element can be eliminated. Hence, the resulting protective element is more reliable.

If the protective element were formed on a thin insulating film such as the gate insulating film, it would be influenced by the voltage (drain voltage) applied to the N$^-$ semiconductor layer 2. In other words, the protective element itself would operate as a reverse MOSFET and lose its function of protecting the gate insulating film of the MOSFET. In accordance with this embodiment, however, the influence of the field effect due to the drain voltage can be reduced because the protective element is formed on the thick field insulating film.

(3) A sufficiently thick insulating film (field insulating film 6) thicker, than the gate insulating film, is formed between the end portion of the protective element consisting of the polycrystalline semiconductor layers (P semiconductor portion T shown in FIG. 1) and the P$^-$ semiconductor layer. Hence, the insulating film itself does not undergo dielectric breakdown.

(4) Since the P well region 3 shown in FIG. 1 is provided, the parasitic capacitance between the gate electrode G and the drain electrode D formed on the other main surface (back surface) of the semiconductor substrate 1 can be reduced. If this P well region 3 is not formed, a large parasitic capacitance would exist between the gate electrode G and the drain electrode D due to the field insulating film 6 and the gate insulating film 7. On the other hand, because of the P well region 3 connected to the source electrode S, the parasitic capacitance between the field insulating film 6 and the gate insulating film 7 does not substantially exist between the gate electrode G and the drain electrode D. Hence, the electric characteristics of the MOSFET are improved by the existence of this P well region 3.

(5) In addition to the P well region 3, the influence of the field effect due to the drain voltage upon the protective element can be further reduced.

The vertical MOSFET described in the above-mentioned embodiment can be fabricated in accordance with a fabrication method described below with reference to FIGS. 8a through 8h.

Figure 8A:
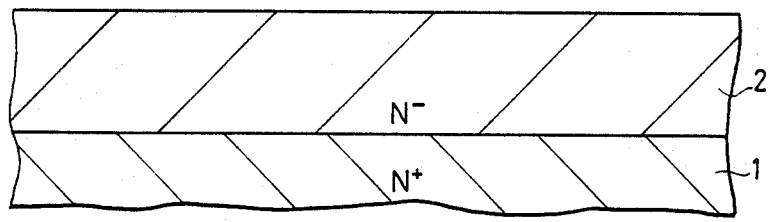
FIGS. 8a through 8h are sectional views showing the fabrication process of the vertical MOSFET in accordance with the present invention.
Figure 8B:
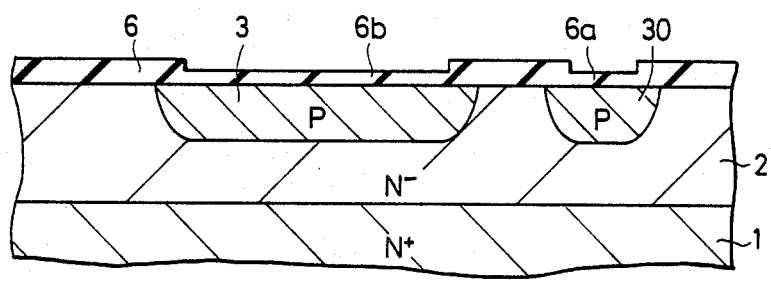
Figure 8C:
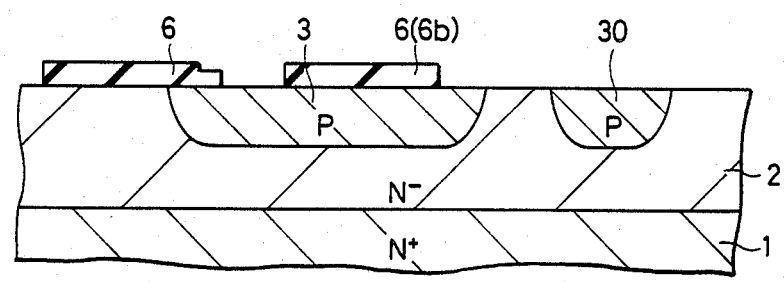

(a) An N$^-$ type Si layer 2 is formed by epitaxial growth on an N$^+$ type Si substrate 1 (see FIG. 8a).

(b) An oxide film (SiO$_2$) 6 is formed by thermal oxidation of the surface of layer 2 and selective etching is effected to leave an exposed field portion in an oxide film 6. Using the oxide film (field oxide film) 6 as the mask, boron ions are deeply implanted to form P well regions 3 and 30. After ion implantation, thermal oxide films (SiO$_2$) 6a and 6b are formed on the surface of the P well regions 30, 3 for the expansion diffusion treatment (see FIG. 8b).

(c) The oxide films 6, 6a are selectively removed in order to expose part of the N$^-$ type Si layer 2 and part of the P well region 30 on which the gate oxide film is to be formed. At the same time, the oxide film 6b on the P well region 3 is slectively removed to expose a portion of region 3 in which a P+ contact region is to be formed while the oxide film 6 on the P$^-$ type Si layer 2 is selectively removed to expose a portion of layer 2 in which an N+ region (channel stopper) will be formed (see FIG. 8c).

Figure 8D:
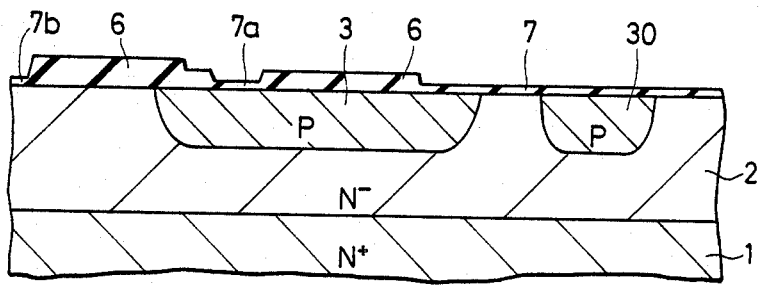

(d) Thin oxide films 7, 7a and 7b are formed on the surfaces of the exposed P well regions 3, 30 and P− Si layer 2 by thermal oxidation (see FIG. 8d). Only oxide film 7 serves as the gate oxide film of the MOSFET.

Figure 8E:
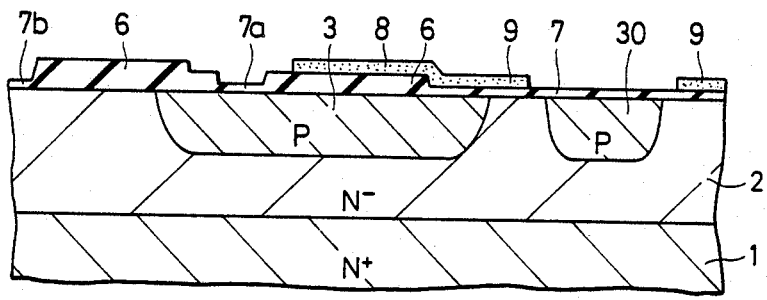
Figure 8F:
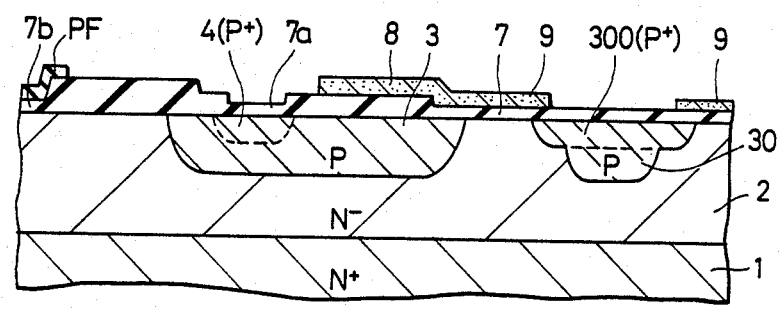
Figure 8G:
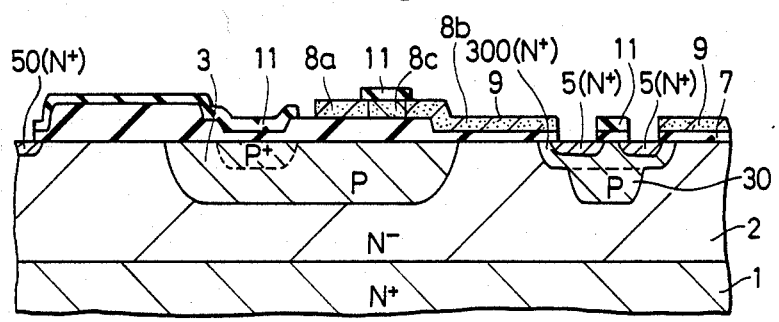
Figure 8H:
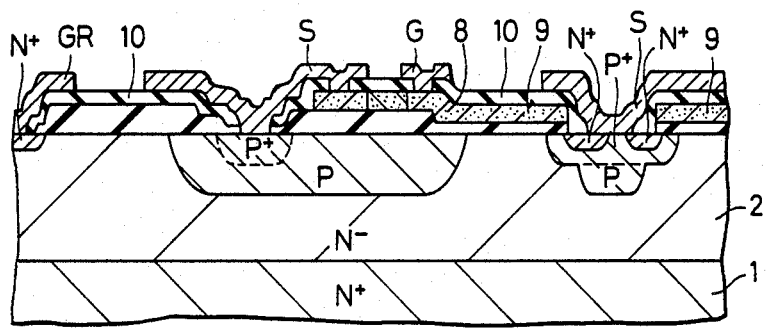

(e) Si is vapor-deposited on the surfaces of the oxide films 6, 7, 7a and 7b to form a polycrystalline Si layer, which is then selectively removed to form the polycrystalline Si layer 8 serving as the gate electrode 9 and protective element (see FIG. 8e).

(f) Using the polycrystalline Si layers 8 and 9 as a mask, boron implantation and expansion diffusion are then carried out, to form the P+ region 300 which is thinner than the well region and is to serve as the channel portion of the MOSFET. In this case, boron is also introduced into the polycrystalline Si layers 8 and 9 and they are converted into P type conductivity. Boron is also implanted into the P well region 3 through the thin oxide film 7a, thereby forming the P+ contact region 4 (see FIG. 8f). It is to be noted that a photoresist film PF is deposited on the thin oxide film 7b to prevent boron from being implanted into the N− Si layer 2 below the thin oxide film 7b.

(g) The oxide films 7, 7b are selectively removed using the photoresist film 11 and the polycrystalline Si layer 9 as a mask to expose the P+ region 300 and the N− Si layer 2. Phosphorus is ion-implanted into the surfaces of the P+ region 300 and the thus exposed N− Si layer 2, and expansion diffusion is then carried out to form the N+ region 5 (see FIG. 8g). The MOSFET is formed by double diffusion self-alignment in this manner. In this process, phosphorus is also introduced into the polycrystalline Si layers 8, 9, forming the N+ semiconductor portions 8a, 8b and 9. Thus, a protective element having an NPN structure is obtained. In this process, too, the N+ region 50 for the channel stopper is simultaneously formed inside the N− Si layer 2.

(h) PSG (phosphosilicate glass) 10 is deposited on the entire surface of the N− Si layer 2 and the PSG film 10 is then contact photo-etched. After the evaporation of aluminum, the aluminum layer is pattern etched to form the source electrode S, the gate electrode G and the guard ring electrode GR (see FIG. 8h).

The vertical MOSFET having the protective element is completed in the above-mentioned manner.

The method for fabricating the MOSFET of the present invention described above provides the advantage in that no specific fabrication step is necessary to form the protective element.

In the above-mentioned fabrication method, it is desirable to form thin oxide films on the surfaces of the polycrystalline Si layers 8 and 9 by oxidizing their surfaces before depositing the PSG film 10.

Figure 9:
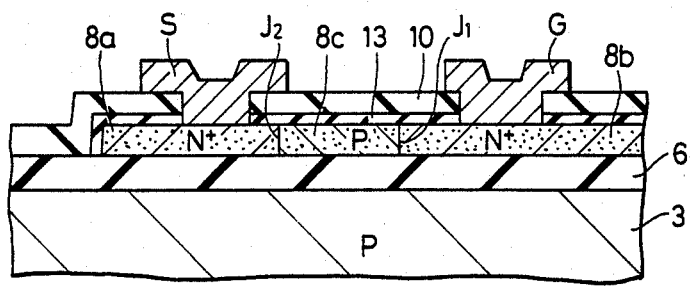
FIG. 9 is a partial sectional view of a protective element fabricated by another fabrication method.

FIG. 9 is an enlarged sectional view of the protective element having the thin oxide film. Since the thin oxide film (SiO2 film) 13 covers the P-N junctions $J_1$ and $J_2$ of the protective element and their end portions, leakage current and degradation of the withstand voltage and electrical characteristics of the protective element can be prevented.

Figure 10:
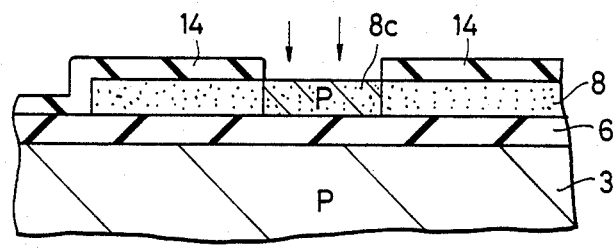
FIG. 10 is a partial sectional view showing a protective element formed by still another fabrication method.

Though the above-mentioned method has been described with reference to the case in which the entire surface of the polycrystalline Si layer 8 is doped with boron simultaneously with the formation of the channel portion (see FIG. 8f), boron may be introduced to the polycrystalline Si layer 8 by forming a photoresist film 14 on the surface of the polycrystalline Si layer 8 as shown in FIG. 10 and then partially introducing boron to form the P semiconductor portion 8c. When this method is employed, the resistance of the N+ semiconductor portions 8a and 8b can be sufficiently lowered.

Examples of modifications of the protective element in accordance with the present invention will now be described.

MODIFICATION EXAMPLE 1

Figure 11:
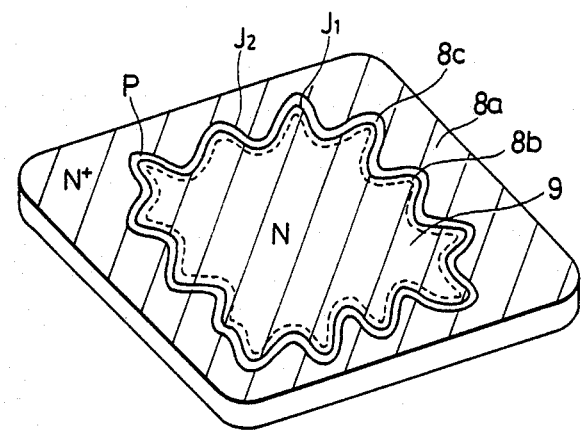
FIG. 11 is a perspective view showing an example of a modification of the protective element.

The length of the P-N junction is preferably elongated in order to obtain current capacitance when the protective element breaks down. To accomplish this object, the P-N junctions $J_1$, $J_2$ in the polycrystalline Si layer are folded as shown in FIG. 11. This arrangeemnt enlarges the area of the P-N junctions, stabilizes the diode withstand voltage and improves the gate protecting effect. The P-N junction can be folded not only in the case of the ring-like junction section but also in the case of an open junction section such as a straight line section.

MODIFICATION EXAMPLE 2

Figure 12:
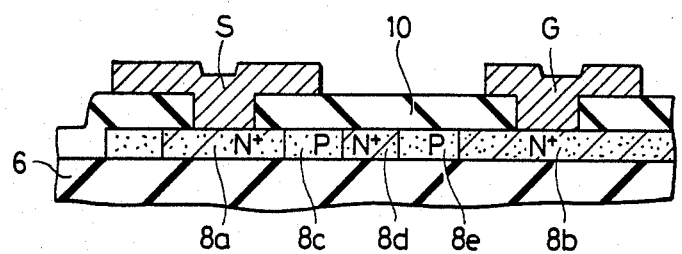
FIG. 12 is a partial sectional view showing another example of a modification of the protective element.

In the foregoing description of the embodiment, the protective element using the polycrystalline Si layers forms the two P-N junction diodes with reference to an example in which a P-N-P junction is formed. However, the present invention is not particularly limited to this structure. For example, the N+ semiconductor portions 8a, 8d, 8b and the P semiconductor portions 8c, 8e may be alternately formed on the polycrystalline Si layer 8, which is formed on the insulating film 6, by selectively doping N and P impurities so as to form a protective element having an N+- P - N+- P - N structure as shown in FIG. 12.

Figure 13:
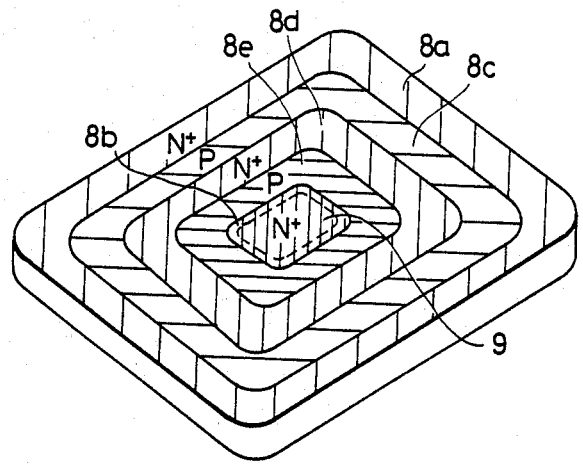
FIG. 13 is a schematic perspective view showing still another example of a modification of the protective element.
Figure 14:
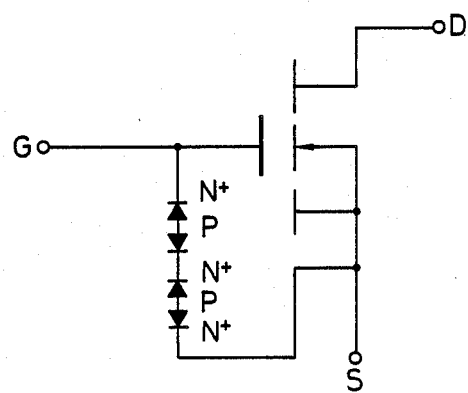
FIG. 14 is an equivalent circuit diagram of the N channel vertical MOSFET corresponding to FIG. 13.

FIG. 13 is a perspective view of the protective element having an N+- P - N+- P - N+ structure and the gate electrode of the MOSFET, and FIG. 14 is an equivalent circuit diagram of the MOSFET having the protective element of the N+- P - N+- P - N+ structure.

All the foregoing embodiments deal with an N channel vertical MOSFET, however, the present invention is not limited to such a structure and can also be applied to a P channel vertical MOSFET. In the case of the P channel vertical MOSFET, all the conduction types of the foregoing embodiments are reversed but the basic structure remains the same as that of the N channel vertical MOSFET.

While we have shown and described several embodiments in accordance with the present invention it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. An insulated gate semiconductor device comprising an insulated gate field effect transistor and a protective element portion for protecting the gate insulating film of said transistor, said transistor comprising:
a semiconductor body of a first conductivity type, said semiconductor body having an upper surface portion and a lower surface portion, wherein said semiconductor body serves as a drain region;
a first region of a second conductivity type, opposite to said first conductivity type, serving as a channel portion, selectively formed in said upper surface portion of said body;

a second region of said first conductivity type serving as a source region selectively formed in said first region;

a gate insulating film disposed on the surface portion of said first region between said second region and said semiconductor body;

a first polycrystalline silicon layer serving as a gate electrode disposed on said gate insulating film and overlaying said channel portion therebeneath;

a source electrode disposed on said second region; and a drain electrode portion disposed on said lower surface portion; and said protective element portion comprising:

a third region of said second conductivity type selectively formed in another portion of said semiconductor body and separated from the first region;

a field insulating film disposed on the surface portion of said third region;

a second polycrystalline silicon layer disposed on said field insulating film; and a plurality of regions of opposite conductivity to one another formed in said second polycrystalline silicon layer and arranged relative to one another to provide a plurality of PN junctions in said second polycrystalline silicone layer, wherein said first and second polycrystalline silicon layers are formed integrally with each other, wherein a thickness of said field insulating film is thicker than a thickness of said gate insulating film to reduce a field effect influence on said protective element by said drain region, and further wherein said third region is located to be interposed between at least a portion of said gate electrode and at least a portion of said drain electrode to reduce parasitic capacitance between said gate electrode and said drain electrode.

2. An insulated gate semiconductor device according to claim 1, wherein said plurality of PN junctions are configured in substantially concentric ring-like shapes from the perspective of the upper surface of the semiconductor body.

3. An insulated gate semiconductor device according to claim 1, further comprising means for electrically connecting said third region to said second region.

4. An insulated gate semiconductor device according to claim 1, wherein said plurality of PN junctions are configured in substantially concentric closed-loop serpentine shapes from the perspective of the upper surface of the semiconductor body.

5. A semiconductor device having both a vertical MOSFET and a protective element for protecting a gate oxide film in said vertical MOSFET, said semiconductor device comprising:

a semiconductor substrate of a first conductivity type serving as a drain region of said vertical MOSFET, said semiconductor substrate having an upper surface portion and a lower surface portion;

a first region of a second conductivity type, opposite to said first conductivity type, serving as a channel portion of said vertical MOSFET, said first region being selectively formed at said upper surface portion of said semiconductor substrate;

a second region of said first conductivity type serving as a source region of said vertical MOSFET, said second region being selectively formed in said first region;

said gate oxide film of said vertical MOSFET disposed on the surface portion of said first region between said second region and said semiconductor substrate;

a gate electrode of said vertical MOSFET which is made of a first polycrystalline silicon layer, said gate electrode being formed on said gate oxide film so that the channel portion of said vertical MOSFET in said first region is overlaid with said gate electrode;

a source electrode disposed on said second region;

a drain electrode portion disposed on said lower surface portion of said semiconductor substrate;

a third region of said second conductivity type selectively formed in said upper surface portion of said semiconductor substrate and separated from the first region; and a field oxide film disposed on the surface portion of said third region, wherein a thickness of said field oxide film is thicker than a thickness of said gate oxide film, wherein said protective element is formed on said field oxide film, said protective element comprising a second polycrystalline silicon layer having a plurality of PN junctions, wherein said protective element is coupled between said gate electrode and said source electrode, and further wherein said first and second polycrystalline silicon layers are formed integrally with each other.

6. A semiconductor device having both a vertical MOSFET and a protective element for protecting a gate oxide film in said vertical MOSFET, said semiconductor device comprising:

a semiconductor substrate of a first conductivity type serving as a drain region of said vertical MOSFET, said semiconductor substrate having an upper surface portion and a lower surface portion;

a first region of a second conductivity type, opposite to said first conductivity type, serving as a channel portion of said vertical MOSFET, said first region being selectively formed at said upper surface portion of said semiconductor substrate;

a second region of said first conductivity type serving as a source region of said vertical MOSFET, said second region being selectively formed in said first region;

said gate oxide film of said vertical MOSFET being disposed on the surface portion of said first region between said second region and said semiconductor substrate;

a gate electrode of said vertical MOSFET which is comprised of a first polycrystalline silicon layer, said gate electrode being formed on said gate oxide film so that the channel portion of said vertical MOSFET in said first region is overlaid with said gate electrode;

a source electrode disposed on said second region;

a drain electrode portion disposed on said lower surface portion of said semiconductor substrate;

a third region of said second conductivity type selectively formed in said upper surface portion of said semiconductor substrate and separated from the first region;

means for electrically connecting said third region to said second region; and a field oxide film disposed on the surface portion of said third region, wherein a thickness of said field oxide film is thicker than a thickness of said gate oxide film, wherein said protective element is formed on said field oxide film, said protective element comprising a second polycrystalline silicon layer having a plurality of PN junctions, wherein said protective element is coupled between said gate electrode and said source electrode, and further wherein said first and second polycrystalline silicon layers are formed integrally with each other.

7. A semiconductor device comprising an MOS transistor and a protective element portion for protecting the gate oxide film of said transistor, said transistor comprising:

a semiconductor body of a first conductivity type serving as a drain region, said semiconductor body having an upper surface portion and a lower surface portion;

a first region of a second conductivity type, opposite to said first conductivity type, serving as a channel portion, selectively formed in said upper surface portion of said body;

a second region of said first conductivity type serving as a source region in said first region;

said gate oxide film being disposed on a surface portion of said first region between said second region and said semiconductor body;

a first polycrystalline silicon layer serving as a gate electrode disposed on said gate oxide film and overlaying said channel portion therebeneath;

a source electrode disposed on said second region; and a drain electrode portion disposed on said lower surface portion; and said protective element portion comprising:

a third region of said second conductivity type selectively formed in another portion of said semiconductor body and separated from the first region; and a field oxide film disposed on a surface portion of said third region;

second polycrystalline silicon layer disposed on said field oxide film; and a plurality of regions of opposite conductivity type to one another formed in said second polycrystalline silicon layer and arranged relative to one another to provide a plurality of PN junctions in said second polycrystalline silicon layer, wherein said first and second polycrystalline silicon layers are formed integrally with each other, and wherein a thickness of said field oxide film is thicker than a thickness of said gate oxide film.

8. An insulated gate semiconductor device according to claim 5, wherein said plurality of PN junctions are configured in substantially concentric ring-like shapes from the perspective of the upper surface portion of the semiconductor substrate.

9. An insulated gate semiconductor device according to claim 5, wherein said plurality of PN junctions are configured in substantially concentric closed-loop serpentine shapes from the perspective of the upper surface portion of the semiconductor substrate.

10. An insulated gate semiconductor device according to claim 6, wherein said plurality of PN junctions are configured in substantially concentric ring-like shapes from the perspective of the upper surface portion of the semiconductor substrate.

11. An insulated gate semiconductor device according to claim 6, wherein said plurality of PN junctions are configured in substantially concentric closed-loop serpentine shapes from the perspective of the upper surface portion of the semiconductor substrate.

12. An insulated gate semiconductor device according to claim 7, wherein said plurality of PN junctions are configured in substantially concentric ring-like shapes from the perspective of the upper surface portion of the semiconductor substrate.

13. An insulated gate semiconductor device according to claim 7, wherein said plurality of PN junctions are configured in substantially concentric closed-loop serpentine shapes from the perspective of the upper surface portion of the semiconductor substrate.

14. An insulated gate semiconductor device according to claim 7, further comprising means for electrically connecting said third region to said second region.

* * * * *